(12) United States Patent
Ikeda

(10) Patent No.: US 6,377,092 B2
(45) Date of Patent: Apr. 23, 2002

(54) DELAY LOCKED LOOP CIRCUIT CAPABLE OF ADJUSTING PHASE OF CLOCK WITH HIGH PRECISION

(75) Inventor: Yutaka Ikeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/727,543

(22) Filed: Dec. 4, 2000

(30) Foreign Application Priority Data

May 18, 2000 (JP) ........................................ 2000-145991

(51) Int. Cl.[7] ............................................... H03D 3/24
(52) U.S. Cl. ....................... 327/158; 327/149; 327/236; 327/144; 331/25; 375/376
(58) Field of Search ................................. 327/141, 149, 327/156, 158, 236, 237; 331/25; 375/376

(56) References Cited

U.S. PATENT DOCUMENTS 5,604,775 A * 2/1997 Saitoh et al. .................. 331/25

FOREIGN PATENT DOCUMENTS

JP 8-274630 10/1996

* cited by examiner

*Primary Examiner*—Dinh T. Le
(74) *Attorney, Agent, or Firm*—McDermott, Will & Emery

(57) ABSTRACT

A DLL circuit includes a fine delay circuit including a first inverter circuit, a second inverter circuit and delay units. The first inverter circuit has an output terminal connected to an output terminal of the second inverter and the first and second inverters are configured of inverters of different sizes. A phase comparator compares a delay clock's phase with a reference clock's phase and a result of the phase comparison is referred to to count addresses which are in turn used to selectively drive the inverters configuring the first and second inverter circuits, to allow the fine delay circuit to output a signal having a phase between signals having therebetween a phase difference of a fixed amount. Thus the clock's phase can be adjusted with high precision.

4 Claims, 14 Drawing Sheets

409~416

DELAY LOCKED LOOP CIRCUIT CAPABLE OF ADJUSTING PHASE OF CLOCK WITH HIGH PRECISION

BACKGROUND OF THE INVENTION

1. Field of the Invention

The present invention relates generally to delay locked loop (DLL) circuits useful for use in semiconductor integrated devices and particularly to DLL circuits capable of adjusting a clock's phase with high precision.

2. Description of the Related Art

A conventional DLL circuit employs a delay chain such as an inverter chain to provide phase matching. The phase matching is provided by automatically selecting from the delay chain's amount of delay varying by a fixed value an amount of delay as required, and holding the amount of delay selected. To provide phase matching with higher precision than the fixed value, as shown in FIG. 14, between inverters 60 and 70 capacitors 62, 64, 66 having different levels of capacitance are connected via N-channel MOS transistors 61, 63, 65 and addresses a0, a1, a2 are applied to selectively turn on/off N-channel MOS transistors 61, 63, 65. Thus, two inverters 60 and 70 provide an amount of delay in a fixed range for adjusting a clock's phase.

In the conventional DLL circuit, however, the inverter chain provides a fixed amount of delay and the capacitors provide a delay smaller than the fixed amount of delay and the inverter chain and the capacitors employ different delay systems. As such, voltage, process and temperature affect the inverter chain and the capacitor differently and the clock's phase can hardly be adjusted.

The FIG. 14 capacitors 62, 64, 66 capacitance variation disadvantageously results in capacitors 62, 64, 66 having an amount of delay exceeding an amount of delay provided by inverters 60 and 70, so that the clock's phase cannot be adjusted in the range of the amount of delay of inverters 60 and 70 with high precision.

SUMMARY OF THE INVENTION

The present invention contemplates a DLL circuit impervious to voltage, process, temperature and the like and thus capable of adjusting a phase of a clock with high precision.

In accordance with the present invention the DLL circuit includes a phase comparator, a counter, a first delay circuit and a second delay circuit. The phase comparator compares a phase of a delay clock with a phase of a reference clock. The counter refers to a result received from the phase comparator, to provide a counting up/down operation and output first and second addresses. The first delay circuit in response to the reference clock generates first and second signals having therebetween a phase difference of a fixed amount and responds to the generated first and second signals and refers to the first signal to generate a fine adjustment clock existing between a phase of the first signal and a phase of the second signal. The second delay circuit refers to the second address to delay the fine adjustment clock by the fixed amount multiplied by an integer to output a delay clock.

In the present DLL circuit, a result of comparing a phase of a delay clock with that of a reference clock can be referred to to provide a counting up/down operation to generate first and second addresses. The first address can be referred to to provide fine control to control the reference clock's phase in the range of a fixed amount T and the second address can be referred to provide coarse control to control the reference clock's phase with the precision of the fixed amount T. Thus the delay clock's phase can be matched to the reference clock's phase in the order smaller than the fixed amount T with high precision.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
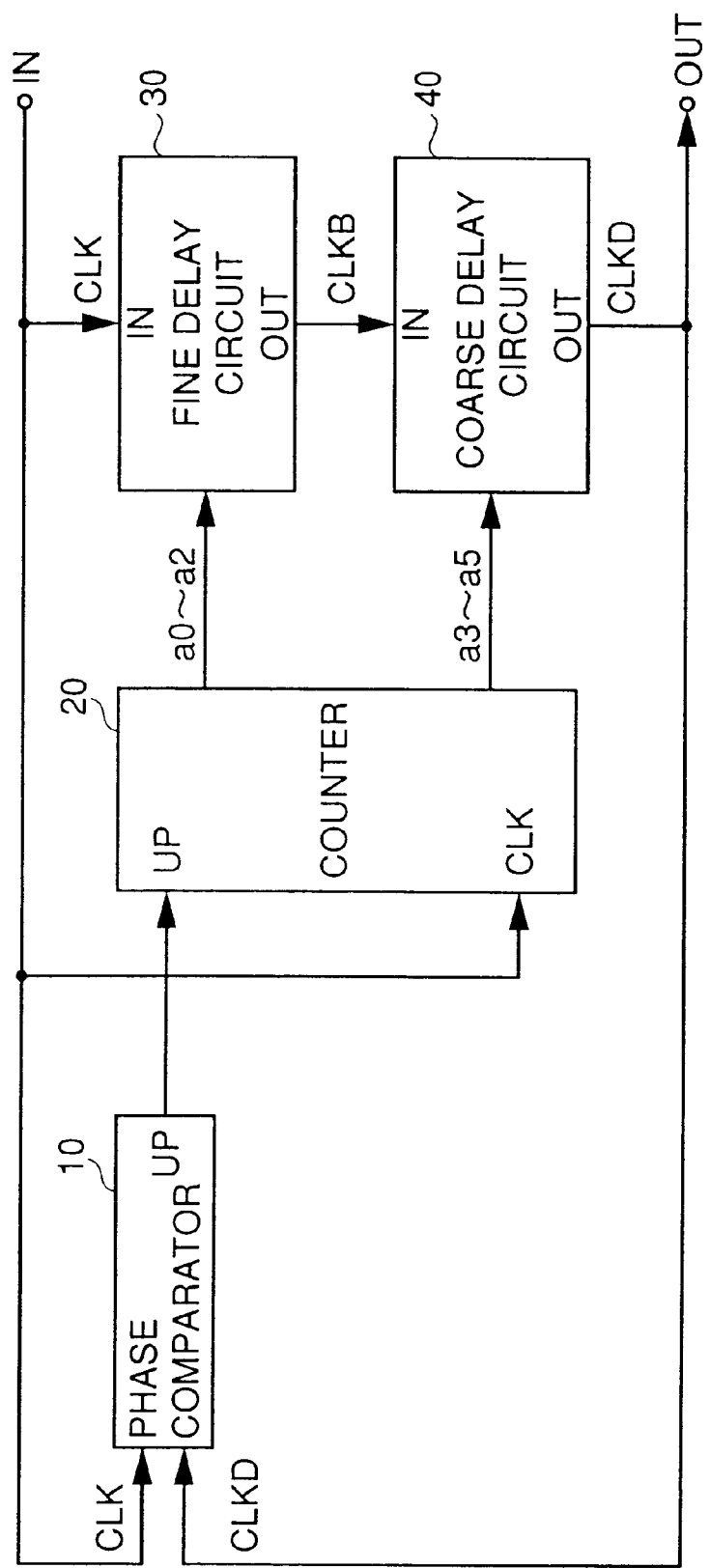
FIG. 1 is a block diagram showing a configuration of a DLL circuit in an embodiment of the present invention.

The embodiments of the present invention will now be described with reference to the drawings. In the figures, like portions are labeled like reference characters and a description thereof will not be repeated.

With reference to FIG. 1, the present invention provides a DLL circuit 100 including a phase comparator 10, a counter 20, a fine delay circuit 30 and a coarse delay circuit 40.

Phase comparator 10 receives a reference clock CLK and a delay clock CLKD, compares a phase of delay clock CLKD with a phase of reference clock CLK, and outputs a result of comparing the phases of the clocks.

Counter 20 refers to the result received from phase comparator 10, to provide a counting up/down operation and output addresses a0–a2 and addresses a3–a5.

Fine delay circuit 30 delays a clock with precision. It receives reference clock CLK and addresses a0–a2 from counter 20 and employs the method as described later to generate a fine adjustment clock CLKB from reference clock CLK and output the generated reference clock CLK. Coarse delay circuit 40 roughly delays a clock. It receives fine adjustment clock CLKB film fine delay circuit 30 and addresses a3–a5 from counter 20 and employs a method described later to delay fine adjustment clock CLKB by a fixed amount multiplied by an integer to output a delay clock CLKD. The output delay clock CLKD is input to phase comparator 10 and also externally output via an output terminal OUT.

Figure 2:
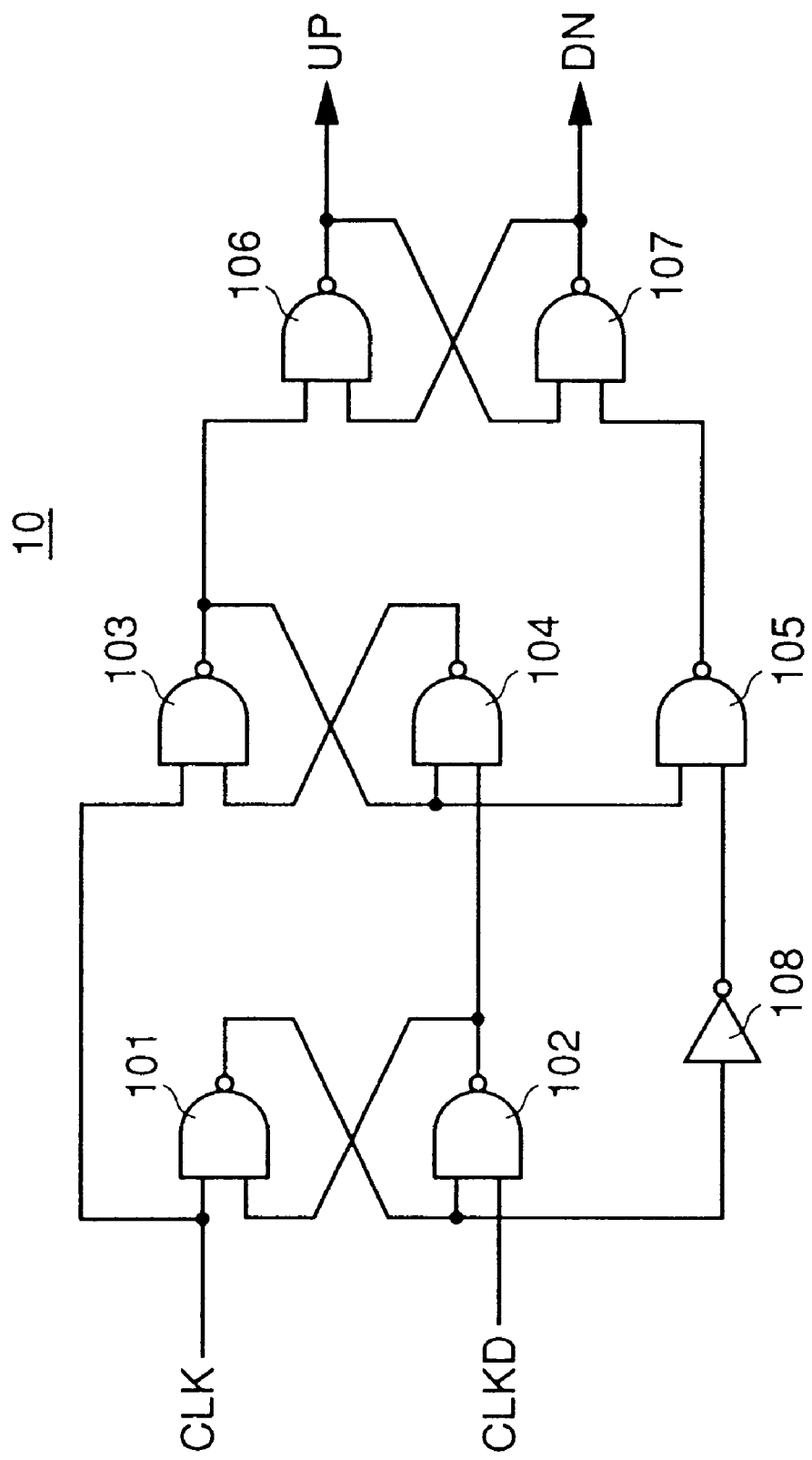
FIG. 2 is a circuit diagram showing a configuration of the phase comparator of the FIG. 1 DLL circuit.

With reference to FIG. 2, phase comparator 10 includes NANDs 101–107 and an inverter 108. NANDs 101 and 102 function as a flip-flop and so do NANDs 103 and 104 and NANDs 106 and 107. Thus, phase comparator 10 compares a phase of delay clock CLKD with that of reference clock CLK and outputs through a terminal UP a signal depending on the delay clock CLKD phase delay. It should be noted that the present embodiment does not use a terminal DN.

Figure 3:
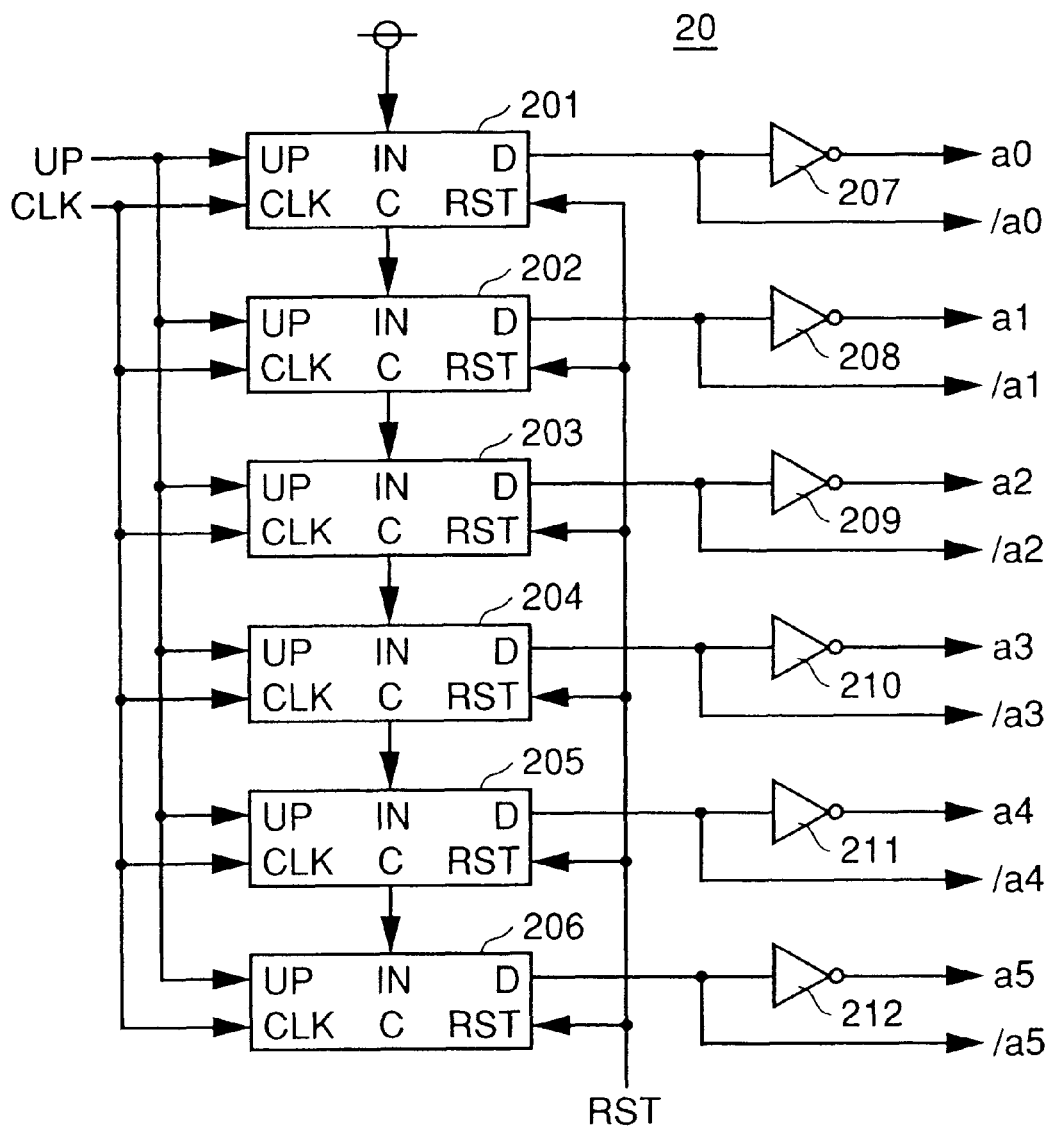
FIG. 3 is a block diagram showing a configuration of the counter of the FIG. 1 DLL circuit.

With reference to FIG. 3, counter 20 includes counter units 201–206 and inverters 207–212. Counter units 201–206 each includes, as shown in FIG. 4, inverters 213, 219, 220, 224, 225, 226, 231, N-channel MOS transistors 214,216,221,223,227, 229, P-channel MOS transistors 215, 217, 228, 230, clocked inverters 218, 222, and an NOR gate 232.

Figure 4:
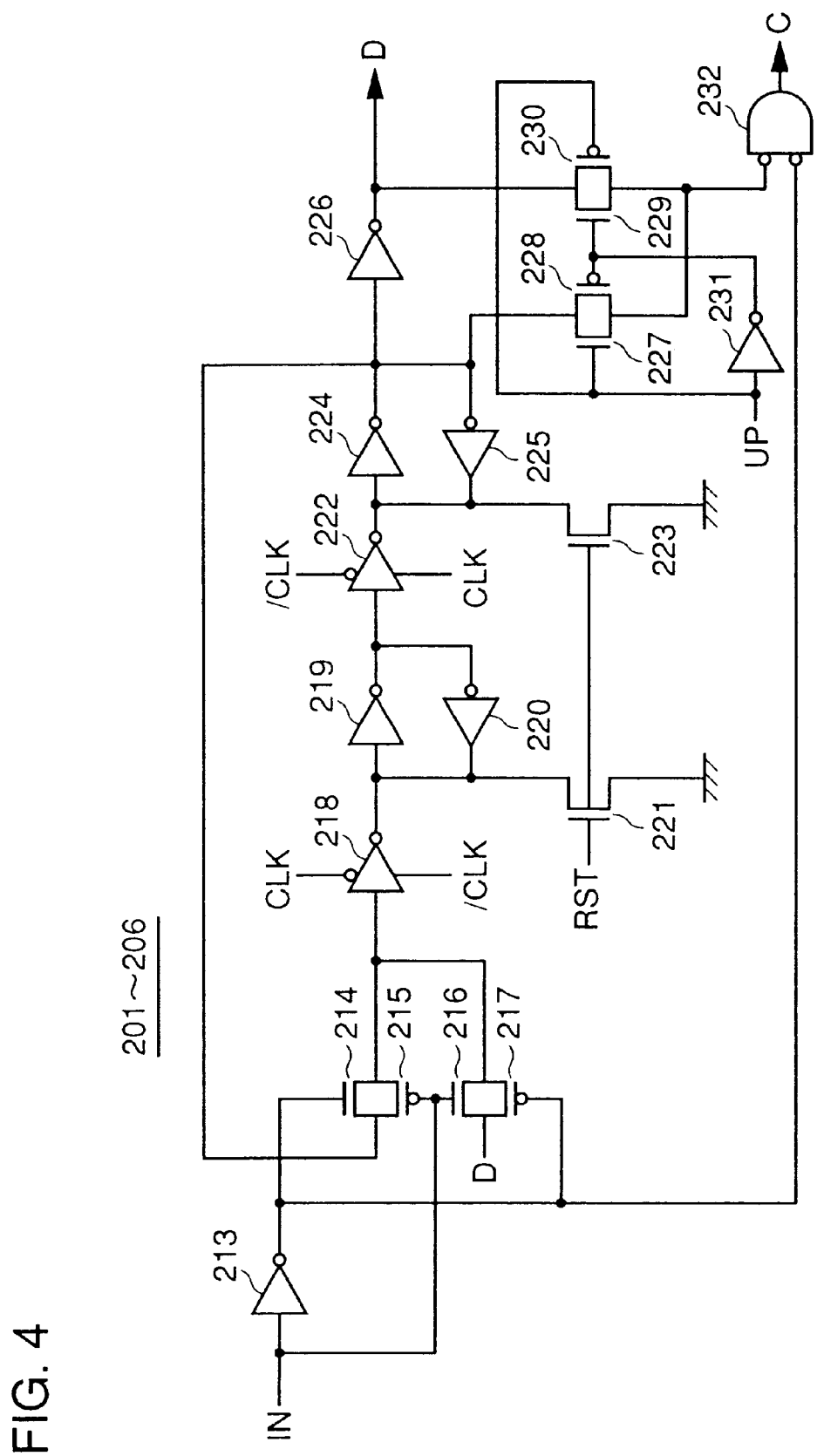
FIG. 4 is a circuit diagram showing a configuration of each counter unit of the FIG. 3 counter.
Figure 5:
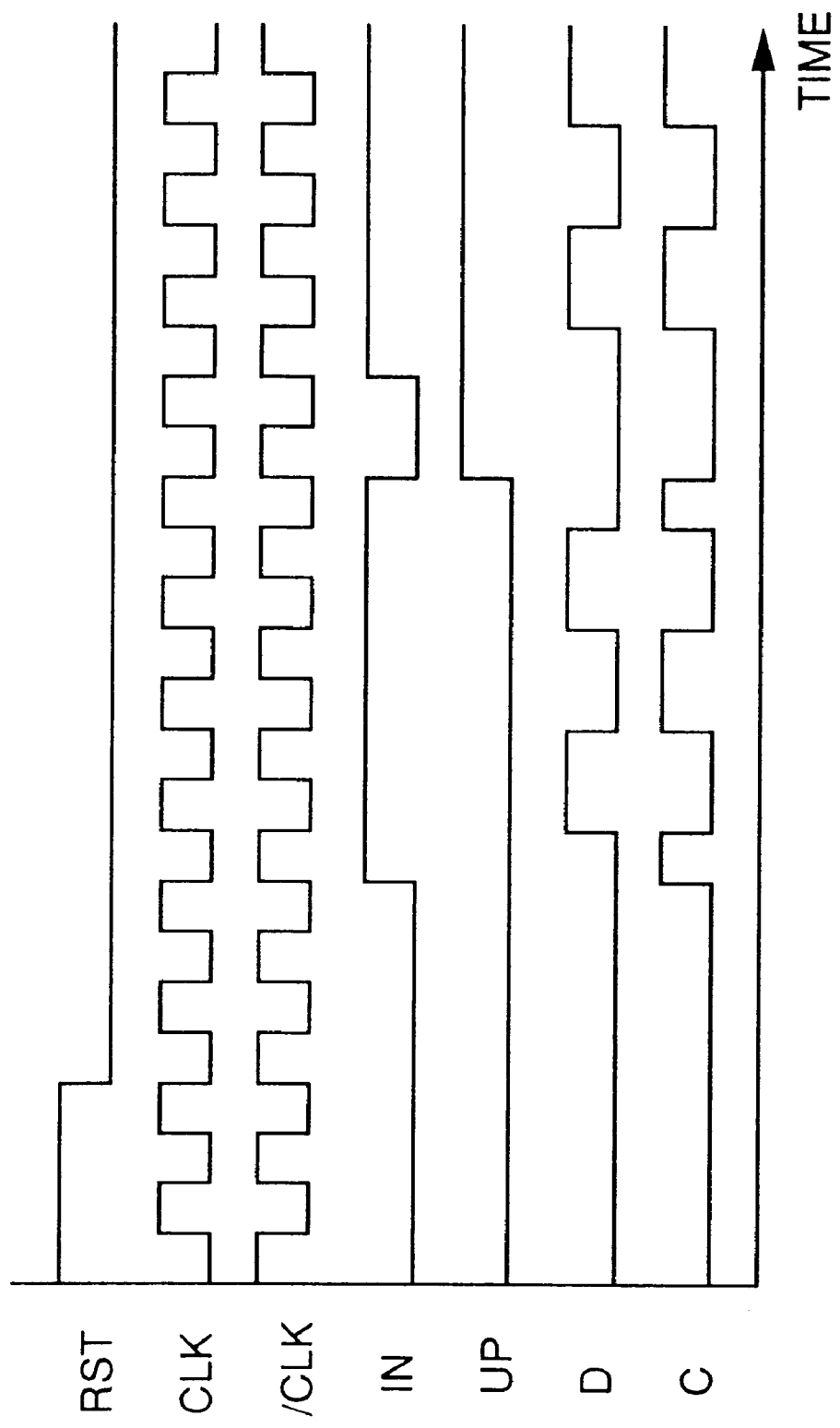
FIG. 5 is timing plots representing the FIG. 4 counter unit operation.
Figure 6:
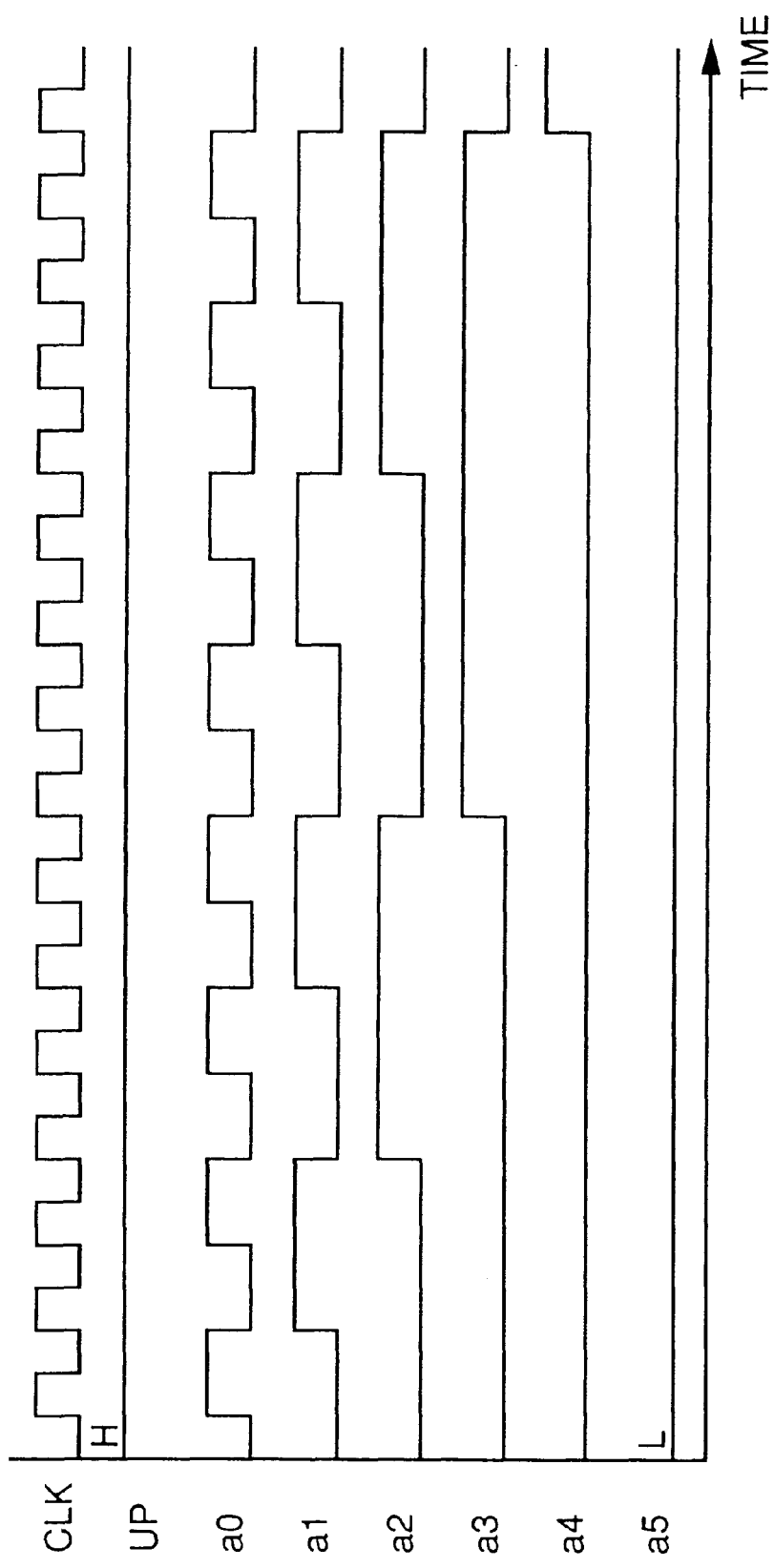
FIG. 6 is timing plots representing addresses output from the FIG. 3 counter at each low to high transition of a reference clock when a delay clock is logical high.
Figure 7:
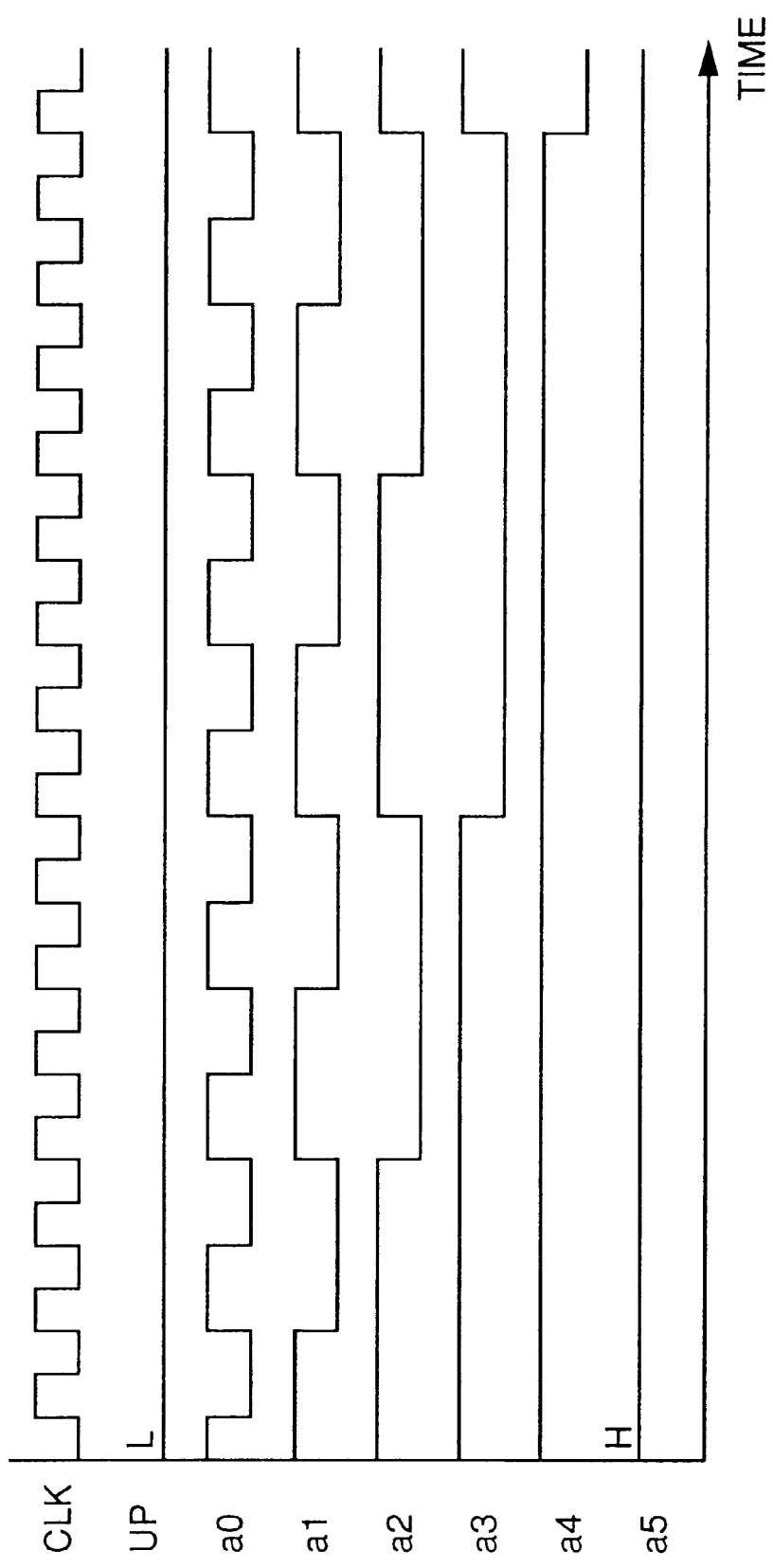
FIG. 7 is timing plots representing an address output from the FIG. 3 counter at each low to high transition of a reference clock when a delay clock is logical low.

When the FIG. 4 counter unit receives a phase comparison result UP from phase comparator 10, reference clock CLK, /CLK and a reset signal RST, the counter unit outputs a carrier signal C and a data signal D, as shown in FIG. 5. When phase comparator 10 compares the delay clock CLKD phase with the reference clock CLK phase and it has been found that whenever reference clock CLK transitions film low to high delay clock CLKD is logical high, the counter units 201–206 terminals UPs receive a high level signal and counter 20 generates the FIG. 6 addresses a0–a5 in each cycle of reference clock CLK. If whenever reference clock CLK transitions from low to high delay clock CLKD is logical low, the counters 201–206 terminals UPs receive a low level signal and counter 20 generates the FIG. 7 addresses a0–a5 in each cycle of reference clock CLK. Thus, counter 20 referring to the result obtained from phase comparator 10 generates addresses a0–a5 and outputs addresses a0–a2 to fine delay circuit 30 and addresses a3–a5 to coarse delay circuit 40.

Figure 8:
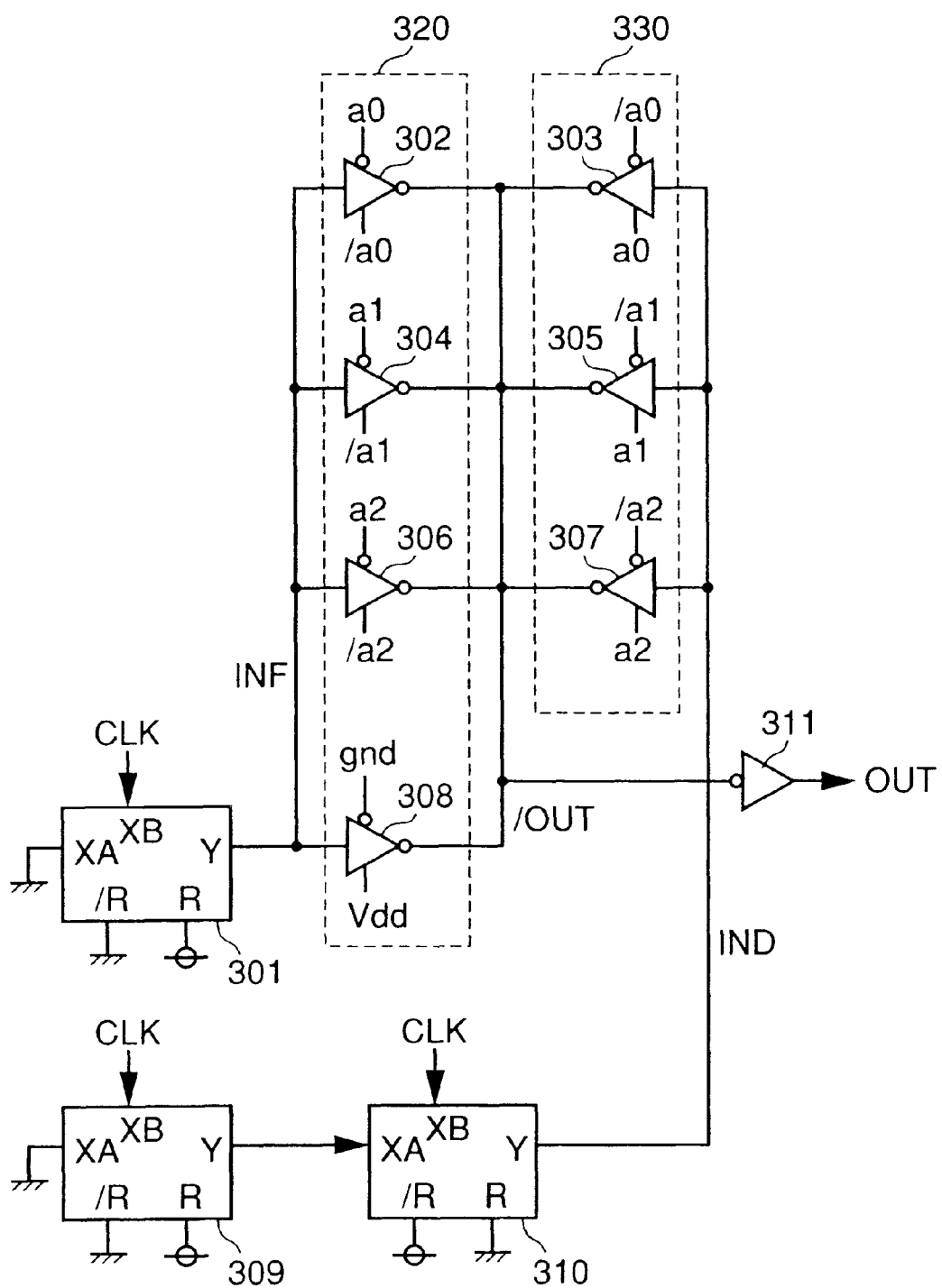
FIG. 8 shows a configuration of a first delay circuit of the FIG. 1 DLL circuit.

With reference to FIG. 8, fine delay circuit 30 includes a delay unit 301, clocked inverters 302–308, delay units 309 and 310, and an inverter 311. Clocked inverter 302 has an output terminal connected to an output terminal of clocked inverter 303. Clocked inverter 304 has an output terminal connected to an output terminal of clocked inverter 305. Clocked inverter 306 has an output terminal connected to an output terminal of clocked inverter 307. Clocked inverters 302, 304, 306, 308 are connected in parallel and so are clocked inverters 303, 305, 307. Clocked inverters 302, 303 have a channel width (hereinafter simply referred to as a "size") n allowing p and n channel MOS transistors configuring an inverter to be equal in channel width, clocked inverters 304 and 305 are of the same size $2n$, clocked inverters 306 and 307 are of the same size $4n$ and clocked inverter 308 has size n. Clocked inverters 302, 303 are driven by addresses a0, /a0 output from counter 20, and when clocked inverter 302 is driven clocked inverter 303 is not driven and when clocked inverter 302 is not driven clocked inverter 303 is driven More specifically, when address a0 is logical low clocked inverter 302 is driven and when address a0 is logical high clocked inverter 303 is driven. Clocked inverters 304, 305 are driven by addresses a1, /a1 output from counter 20 and clocked inverters 306, 307 are driven by addresses a2, /a2 output from counter 20. Clocked inverters 304 and 305 and clocked inverters 306 and 307 are driven in the same manner as clocked inverters 302 and 303.

Figure 9:
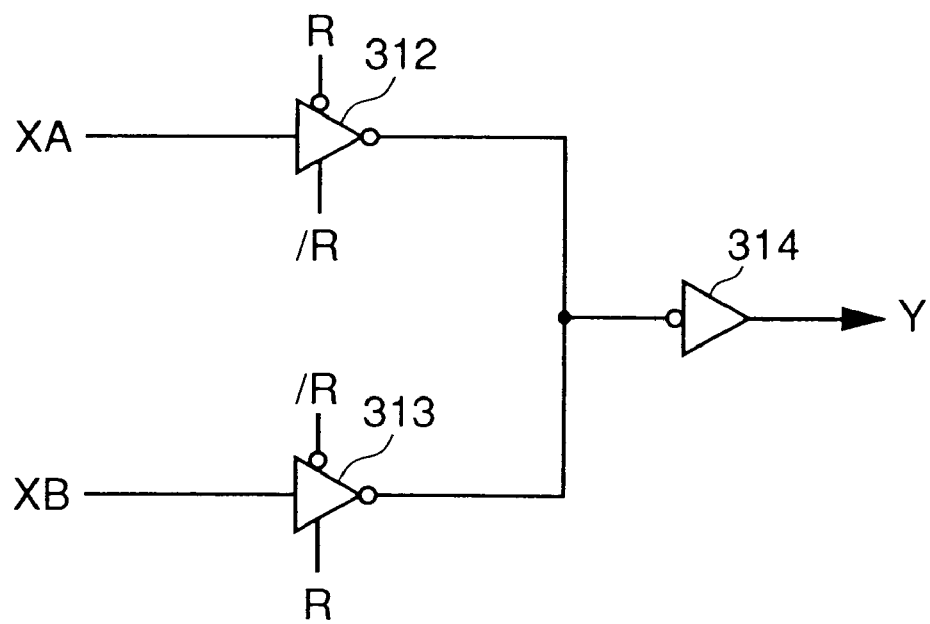
FIG. 9 is a circuit diagram showing a configuration of each fine delay unit of the FIG. 8 delay circuit.

With reference to FIG. 9, delay units 301, 309, 310 each include clocked inverters 312 and 313 and an inverter 314. Clocked inverter 312 is driven in response to a signal R of logical low and for an input signal XA functions as an inverter, while clocked inverter 313 is not driven. Clocked inverter 313 is driven in response to signal R of logical high and for an input signal XB functions as an inverter, while clocked inverter 312 is not driven. Thus, depending on whether signal R is logical low or high, clocked inverter 312 or 313 is driven and input signal XA or XB is inverted and thus input to inverter 314, which further inverts the received inverted signal and thus provides an output signal Y. Thus, delay units 301, 309, 310 delays the input signals XA and XB phases by a fixed amount T.

Again with reference to FIG. 8, delay unit 301, with signal R of logical high and signal /R of logical low, delays the received reference clock CLK phase by the predetermined amount T and thus outputs a signal INF. Similarly, delay unit 309 delays the received reference clock CLK phase by the fixed amount T and thus outputs a signal Y. Delay unit 310, with signal R of logical low and signal 1R of logical high, delays the received signal XA(Y) phase by the fixed amount T and thus outputs a signal IND. Thus, signal INF corresponds to the reference clock CLK phase delayed by the fixed amount T and signal IND corresponds to the reference clock CLK phase delayed by the fixed amount T multiplied by two. Thus signals INF and IND have therebetween a phase difference of the fixed amount T.

Clocked inverters 302–307 are activated selectively by addresses a0–a2 output from counter 20. When counter 20 outputs addresses a0, a1 and a2 all equal to 0, clocked inverters 302, 304, 306, 308 are activated and clocked inverters 302, 304, 306, 308, connected in parallel, have a composite size $w_f$ of n+2n+4n+n=8n, while clocked inverters 303, 305, 307 are not activated and clocked inverters 303, 305, 307, connected in parallel, have a composite size $w_d$ of 0.

For addresses a0, a1 and a2 all equal to 1, clocked inverters 302, 304, 306 are not activated and clocked inverters 303, 305, 307, 308 are activated, resulting in composite size $w_d$ of n and composite size $w_d$ of 7n. For all addresses a0–a2, composite sizes $w_f$ and $w_f$ are calculated, as provided in Table 1:

TABLE 1

| a0 | a1 | a2 | Wf | Wd |
|----|----|----|----|----|
| 0 | 0 | 0 | 8n | 0 |
| 1 | 0 | 0 | 7n | n |
| 0 | 1 | 0 | 6n | 2n |
| 1 | 1 | 0 | 5n | 3n |
| 0 | 0 | 1 | 4n | 4n |
| 1 | 0 | 1 | 3n | 5n |
| 0 | 1 | 1 | 2n | 6n |
| 1 | 1 | 1 | n | 7n |

For addresses a0–a2, composite size $w_f$ varies from 8n to n and composite size $w_d$ varies from 0 to 7n. As such, clocked inverters 302, 304, 306, 308 connected in parallel are considered a single clocked inverter circuit 320 having a size varying from 8n to n for addresses a0–a2, and clocked inverters 303, 305, 307 connected in parallel are considered another single clocked inverter circuit 330 having a size varying film 0 to 7n for addresses a0–a2.

Figure 10:
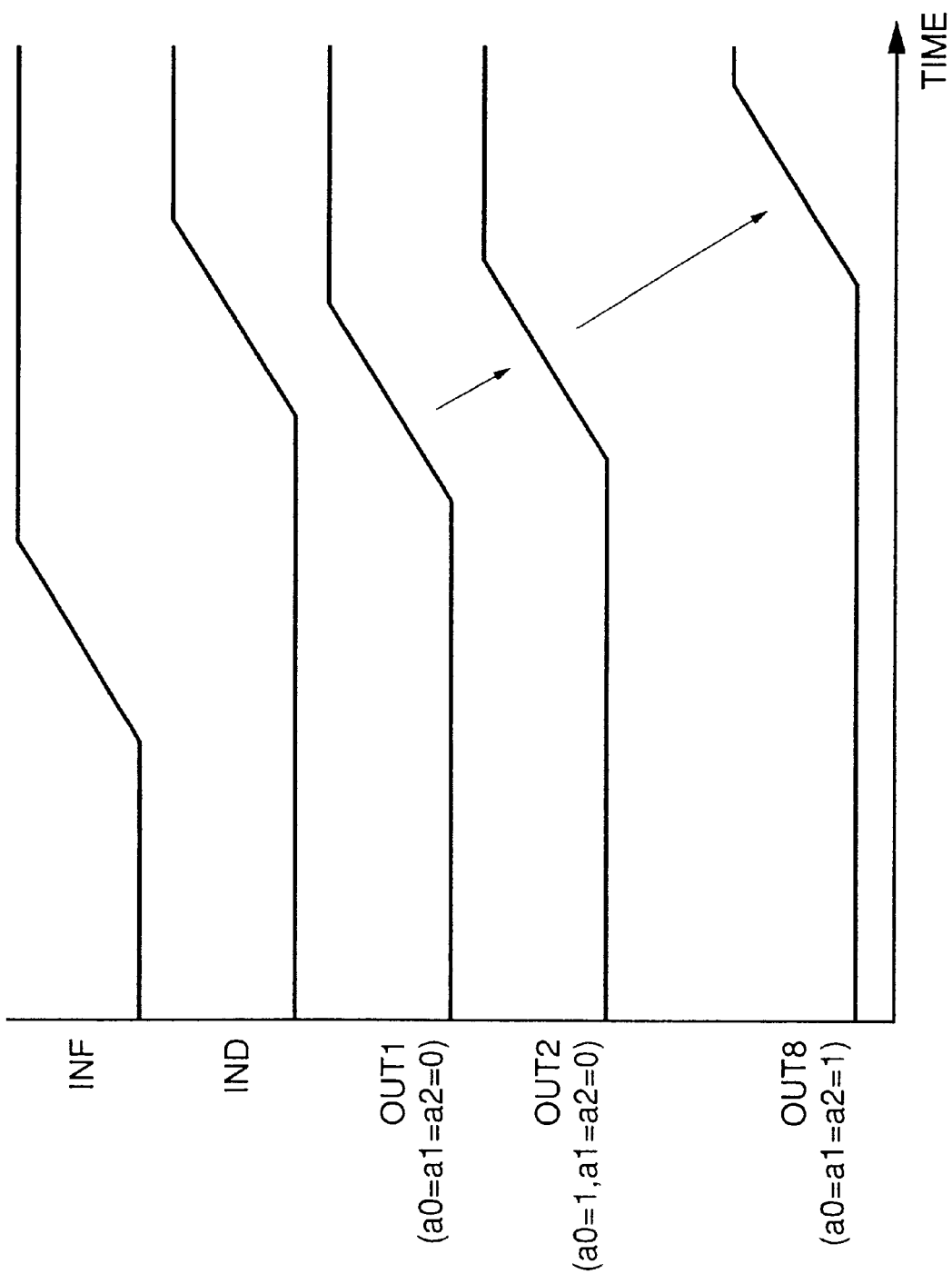
FIG. 10 is timing plots representing the FIG. 8 fine delay circuit operation.

With reference to FIG. 10, when addresses a0, a1, a2 are all equal to 0 clocked inverter circuits 320 and 330 receive signals INF and IND, respectively, and a signal OUT1 is output. For addresses a0=1, a1=0 and a2=0, a signal OUT2 is output. For addresses a0, a1, a2 all equal to one, a signal OUT8 is output. Thus, signals OUT1, OUT2, ..., OUT8 are output with a phase determined by a ratio between the clocked inverter circuit 320 composite size $w_f$ and the clocked inverter circuit 330 composite size $W_d$. Thus, fine delay circuit 320 can output signals OUT1, OUT2, ..., OUT8 having a phase linearly varying with addresses a0–a2.

Figure 11:
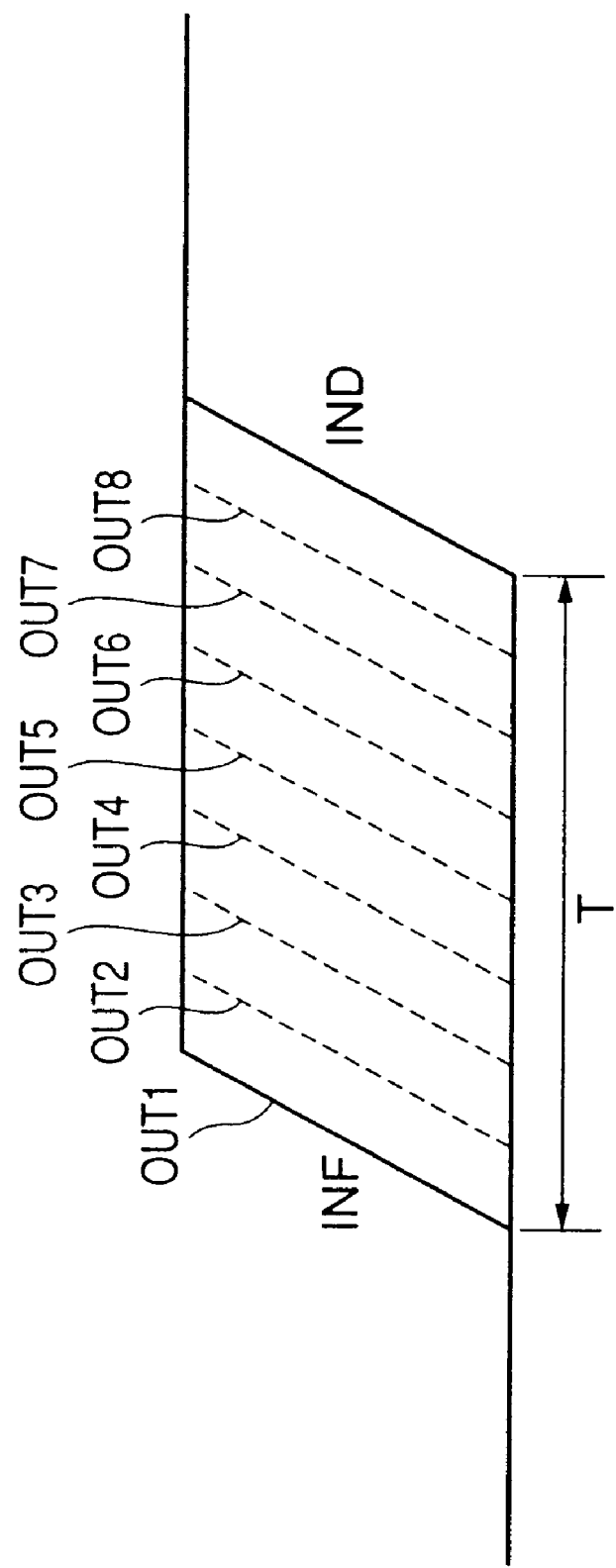
FIG. 11 illustrates that the FIG. 8 fine delay circuit can change a phase in the order smaller than a fixed amount.

When composite size $W_f$ is 8n and composite size $W_d$ is zero, signal OUT1 is output and thus corresponds to signal INF. As such, with reference to FIG. 11, fine delay circuit 30 outputs signals OUT2, OUT3, OUT4, OUT5, OUT6, OUT7, OUT8 having a phase existing between signal INF and signal IND having a phase difference of the fixed amount T relative to signal INF.

As described above, signals OUT1, OUT2, ..., OUT 8 are output having a phase varying with the ratio between the clocked inverter circuit 320 composite size $W_f$ and the clocked inverter. circuit 330 composite size $W_d$ that are determined by addresses a0–a2. This corresponds to receiving two signals INF and IND having therebetween a phase difference of the fixed amount T, and referring to addresses a0–a2 to determine composite sizes $w_f$ and $w_d$ which are in turn referred to to variably weight signals INF and IND, respectively, to output signals OUT1–OUT8 having a variable phase.

While in the above description fine delay circuit 30 delays reference clock CLK and thus generates signals INF and IND with a phase difference of the fixed amount T, the present invention is not limited thereto and the reference clock CLK phase may be advanced or delayed to consequently generate two signals INF and IND with a phase difference of the fixed amount T.

Figure 12:
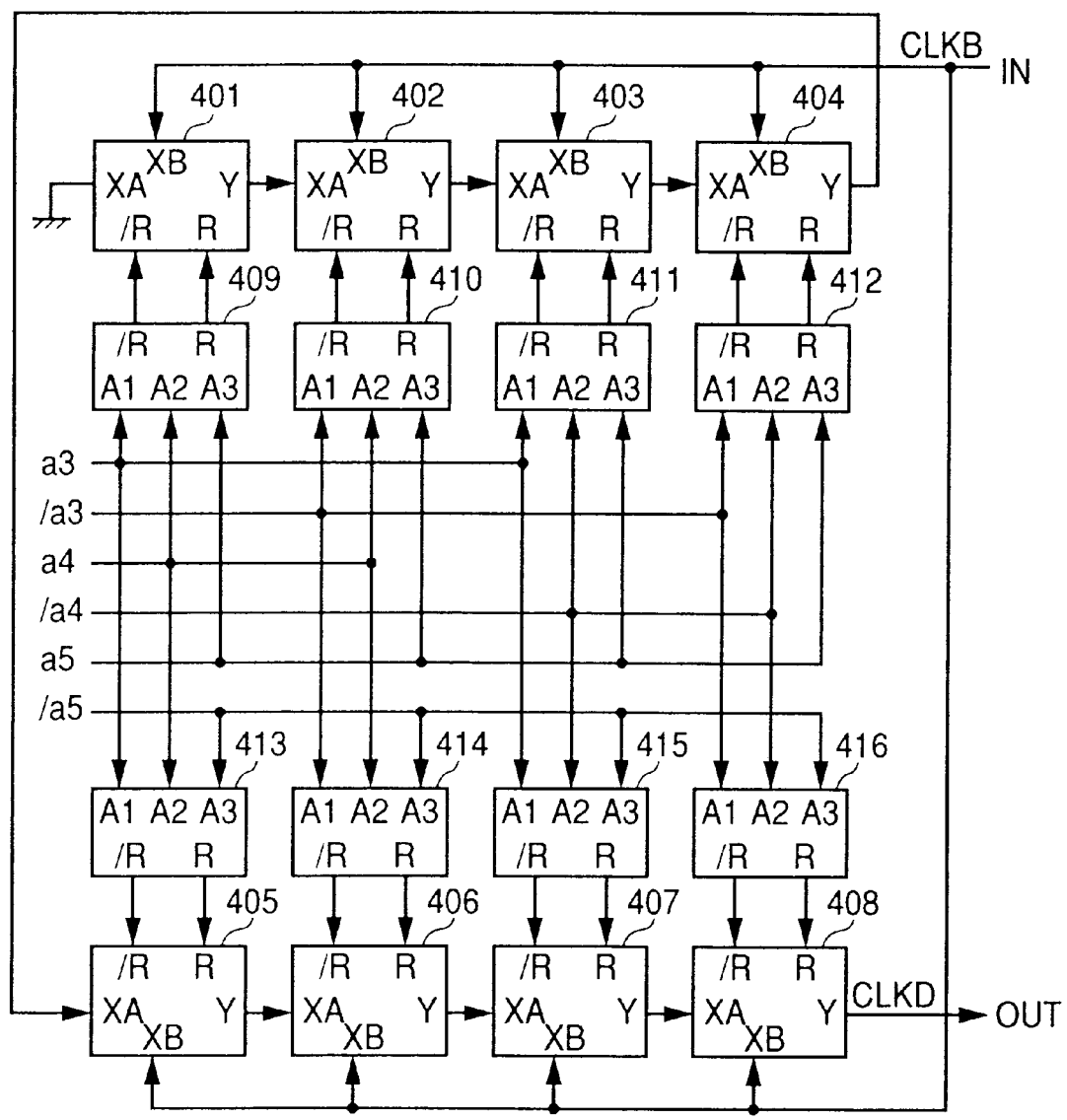
FIG. 12 is a circuit diagram showing a configuration of the coarse delay circuit of the FIG. 1 DLL circuit.
Figure 13:
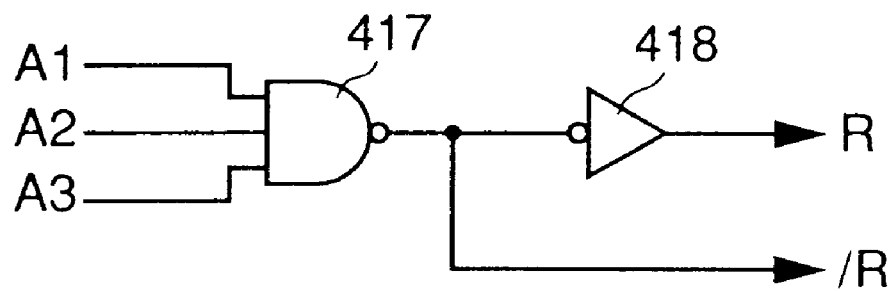
FIG. 13 is a circuit diagram showing a configuration of each decoder of the FIG. 12 coarse delay circuit.
Figure 14:
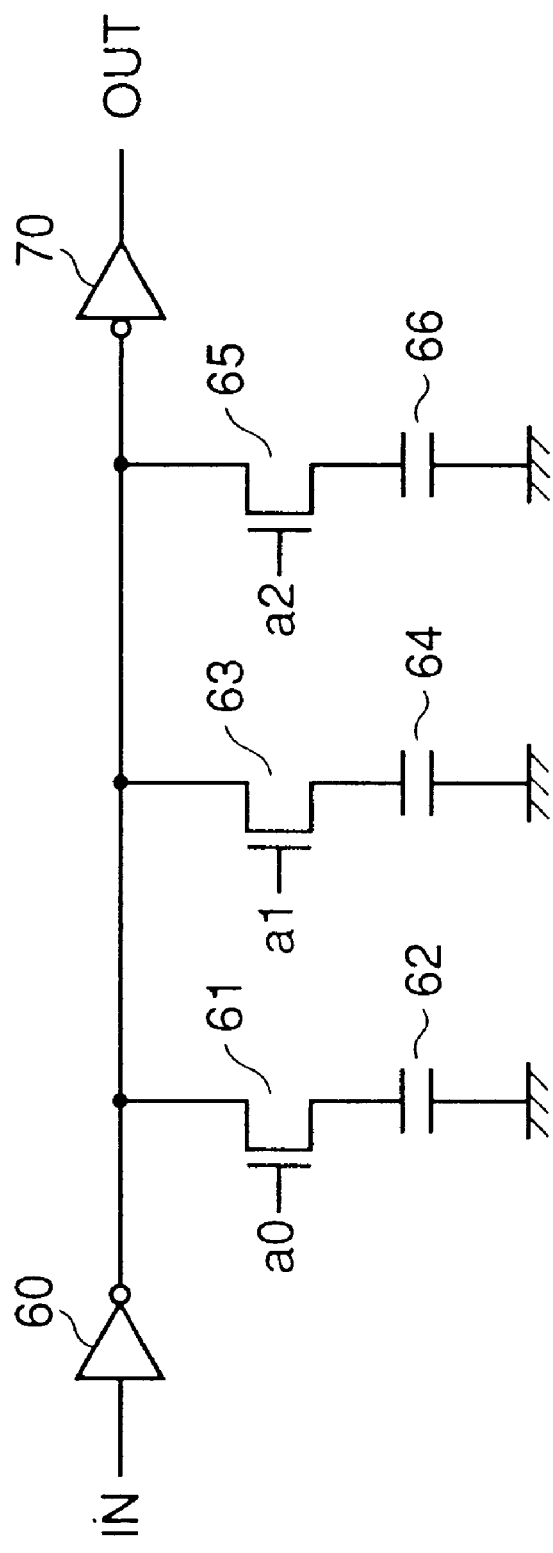
FIG. 14 is a circuit diagram showing a conventional inverter chain for fine adjustment of a phase of a clock.

With reference to FIG. 12, coarse delay circuit 40 includes delay units 401–408 and decoders 409–416. Delay units 401–408 have the same configuration as the FIG. 9 delay units 301, 309, 310 and delay the input signals XA and XB phases by the fixed amount T. Decoders 409–416 each include, as shown in FIG. 13, a 3-input NAND 417 and an inverter 418. Decoders 409–416 respond to input signals A1, A2, A3 by outputting signals R, /R.

Again with reference to FIG. 12, decoders 409–416 receive addresses a3–a5 from counter 20 and output signals R and /R to delay units 401–408. When signal R is logical high delay units 401–408 delay input signal XA by the fixed amount T and when signal R is logical high they delay input signal XB by the fixed amount T. Thus, coarse delay circuit 40 determines the number of stages of delay units 401–408 delaying a phase of fine adjustment clock CLKB input by decoders 409–416, and delays the fine adjustment clock CLKB phase by the determined number of stages. For example, when addresses a3=0, a4=1 and a5=0, decoders 409, 410, 411, 412, 413, 415, 416 output signal R of logical low and signal /R of logical high and decoder 414 outputs signal R of logical high and signal /R of logical low. As a result, delay units 401–405, 407, 408 delay the input signal XA phase by the fixed amount T and delay unit 406 delays the input signal XB phase by the fixed amount T. Since the initial-stage delay unit 401 input signal XA is constantly logical low, delay units 401–405 do not delay the received fine adjustment clock CLKB phase while delay units 406–408 each delay the fine adjustment clock CLKB phase by the fixed amount T. As such, for addresses a3=0, a4=1 and a5=0, fine adjustment clock CLKB has its phase delayed by three stages corresponding to delay units 406, 407, 408 by the fixed amount T multiplied by three and it is thus output as delay clock CLKD.

As has been described above, in DLL circuit 100 the delay clock CLKD phase can be compared with the reference clock CLK phase and the result of the phase comparison can be referred to to generate address a0–a2 and a3–a5. Addresses a0–a2 can be used to allow fine delay circuit 30 to provide an amount of delay controlled in the order smaller than the fixed amount T with precision and addresses a3–a5 can be used to allow coarse delay circuit 40 to provide an amount of delay with the precision of the fixed amount T. Thus the delay clock CLKD phase can be matched to the reference clock CLK phase. It should be noted that the above described DLL circuit 100 is useful when it is used in a fast-response semiconductor integrated circuit device such as a DRAM having memory cells arranged in array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay locked loop circuit comprising:

a phase comparator comparing a phase of a delay clock with a phase of a reference clock;

a counter driven by a result received from said phase comparator comparing the phase of said delay clock with the phase of said reference clock, to provide a counting up/down operation and output first and second addresses;

a first delay circuit generating a response to said reference clock first and second signals having therebetween a phase difference of a fixed amount, and responding to the generated first and second signals and driven by said first address to generate a fine adjustment clock having a phase existing between a phase of said first signal and a phase of said second signal; and a second delay circuit driven by said second address to delay said fine adjustment clock by said fixed amount multiplied by an integer to output said delay clock.

2. The delay locked loop circuit according to claim 1, wherein said first delay circuit is driven by said first address to weigh said first and second signals to generate said fine adjustment clock.

3. The delay locked loop circuit according to claim 2, wherein:

said first delay circuit includes a first inverter circuit having a size determined to weigh said first signal, and a second inverter circuit having an output terminal connected to an output terminal of said first inverter circuit, and having a size determined to weigh said second signal; and said counter outputs to said first delay circuit said first address for determining said first and second inverter circuits in size.

4. The delay locked loop circuit according to claim 1, wherein:

said first delay circuit includes a plurality of first inverters different in size and connected in parallel, and a plurality of second inverters having an output terminal connected to an output terminal of said plurality of first inverters, different in size and connected in parallel; and said counter outputs to said first delay circuit said first address for selectively activating said first and second inverters.

* * * * *